United States Patent
Bristol et al.

(10) Patent No.: US 11,846,883 B2
(45) Date of Patent: Dec. 19, 2023

(54) CHAIN SCISSION PHOTORESISTS AND METHODS FOR FORMING CHAIN SCISSION PHOTORESISTS

(71) Applicant: Intel Corporation, Santa Clara, CA (US)

(72) Inventors: Robert Bristol, Portland, OR (US); Marie Krysak, Portland, OR (US); Lauren Doyle, Hillsboro, OR (US); James Blackwell, Portland, OR (US); Eungnak Han, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 990 days.

(21) Appl. No.: 16/147,131

(22) Filed: Sep. 28, 2018

(65) Prior Publication Data
US 2020/0103754 A1    Apr. 2, 2020

(51) Int. Cl.
*G03F 7/039*    (2006.01)
*G03F 7/004*    (2006.01)

(52) U.S. Cl.
CPC ............ *G03F 7/039* (2013.01); *G03F 7/0043* (2013.01); *G03F 7/0045* (2013.01)

(58) Field of Classification Search
CPC ...... G03F 7/039; G03F 7/0392; G03F 7/0043; C08F 220/282
See application file for complete search history.

(56) References Cited

U.S. PATENT DOCUMENTS

| | | | |
|---|---|---|---|
| 6,576,400 B1 * | 6/2003 | Tamura | G03F 7/039 430/326 |
| 2010/0203450 A1 * | 8/2010 | Fujiwara | C09D 125/18 430/326 |
| 2014/0065550 A1 * | 3/2014 | Kramer | C08F 2/38 430/311 |
| 2017/0123312 A1 * | 5/2017 | Lewis | H01L 21/78 |
| 2017/0285482 A1 * | 10/2017 | Tsuchihashi | G03F 7/16 |

* cited by examiner

*Primary Examiner* — John S Chu
(74) *Attorney, Agent, or Firm* — Schwabe, Williamson & Wyatt, P.C.

(57) ABSTRACT

A photoresist is disclosed. The photoresist includes a polymer with one repeating unit and an absorbing unit.

10 Claims, 6 Drawing Sheets

X = F, Cl, Br or I

CHAIN SCISSION PHOTORESISTS AND METHODS FOR FORMING CHAIN SCISSION PHOTORESISTS

TECHNICAL FIELD

Embodiments of the disclosure pertain to forming photoresists and, in particular, to forming chain scission photoresists.

BACKGROUND

A photoresist is a light-sensitive material used in photolithography to form a patterned coating on a surface. The process begins by coating a substrate with a light-sensitive organic material. A patterned mask is then applied to the surface to block light, so that only unmasked regions of the material will be exposed to light. A solvent, called a developer, is then applied to the surface. In the case of a positive photoresist, the photo-sensitive material exposed to light is degraded and the developer will dissolve away the regions that were exposed to light, leaving behind a coating where the mask was placed. In the case of a negative photoresist, the photosensitive material is strengthened (either polymerized or cross-linked) by light, and the developer will dissolve away only the regions that were not exposed to light, leaving behind a coating in areas where the mask was not placed. In the standard approach, photoresists are made up of a random mixture of components. Some of these components have a fairly low concentration and thus are subject to large percentage fluctuations with respect to location.

One component of the photoresist that can have a fairly low concentration in the random mixture of components is the base quencher. The base quencher controls the action of the photo acid generator in the photoresist which drives the solubility switch of the polymer. The low concentration of the base quencher can contribute to large fluctuations in the amount of the base quencher in the photoresist with respect to location on the substrate. For example, photoresist material associated with patterned features of the same size that are located at different places on the substrate, is very likely to contain different amounts of the base quencher. Accordingly, the material associated with these features is likely to have different sensitivities. In a previous approach, in photoresist solution for features with an approximately 25 nm target critical dimension (CD), concentrations of the base quencher only amounted to about 500 molecules. For a normal distribution, this implies a variation of about 33% at the 7 sigma level. As the base quencher directly influences sensitivity, the photoresist can be removed at rates that range from too fast or too slow causing the CD to fluctuate greatly from the target CD (possibly even failing to print at all).

DESCRIPTION OF THE EMBODIMENTS

Figure 1:
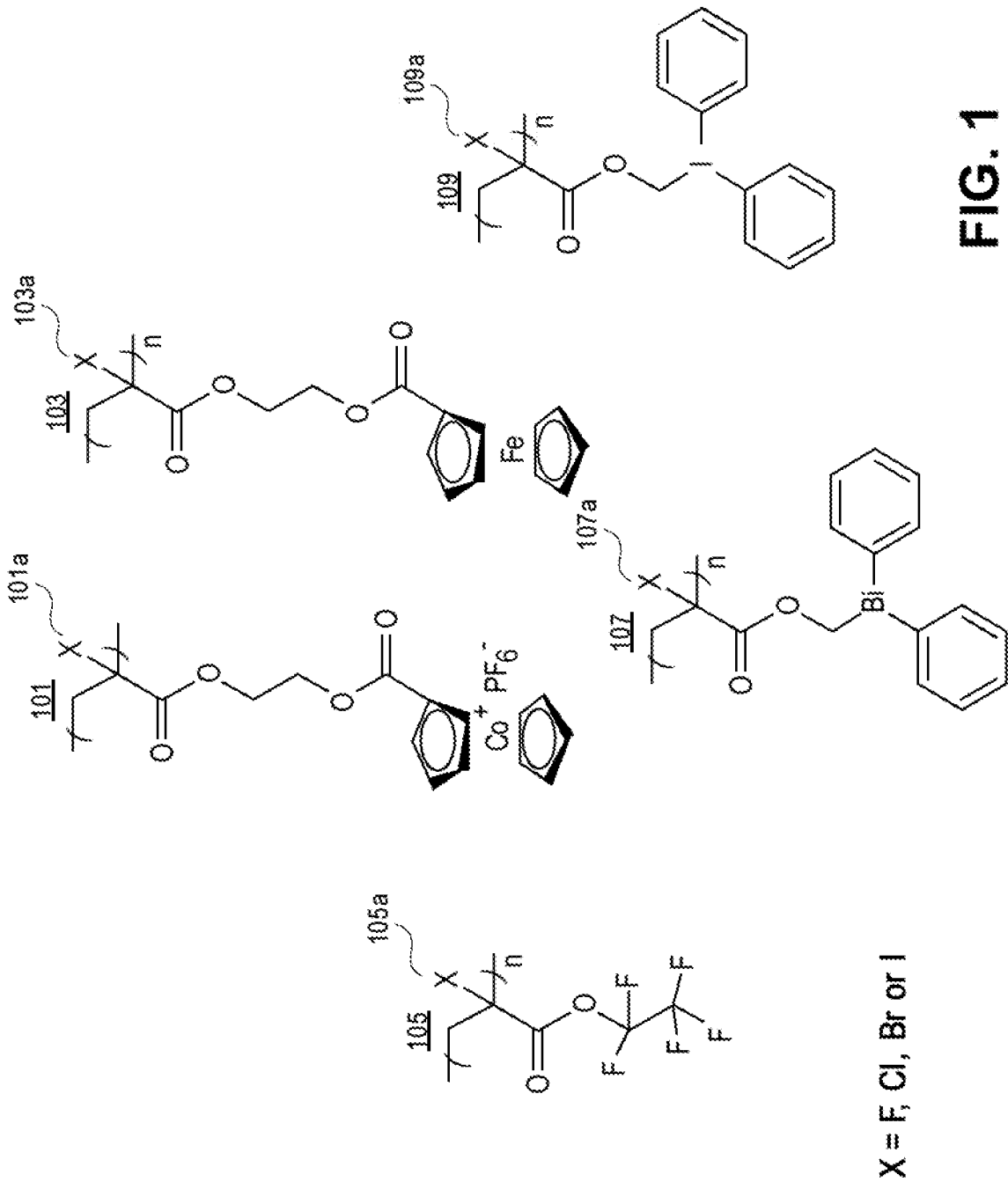
FIG. 1 shows skeletal formulas of a plurality of polymers according to an embodiment.

The forming of chain scission photoresists is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In previous approaches to controlling photoresist nano-uniformity attempts are made to control a quencher component of the photoresist because this component directly influences resist sensitivity. In such approaches, the quencher component of the photoresist can have a fairly low concentration of molecules (e.g., 500 or less). Moreover, for a normal distribution this implies a variation of about 33 percent. As such, some portions of the photoresist can have lesser amounts of base quencher than other portions of the photoresist (or in some cases no base quencher at all). Because of the fluctuation and the direct influence of the quencher on sensitivity, some regions of the photoresist can deviate greatly from the target or fail to print at all.

An approach to forming photoresists that addresses the shortcomings of previous approaches is disclosed herein. As a part of the disclosed approach, a photoresist is formed that is composed of a single molecule (a polymer made of one monomer). As such, the problems caused by the non-uniformity of base quenchers in photoresists that include a mixture of components is obviated. More specifically, forming the photoresist to have one molecule eliminates fluctuations caused by the random mixture of multiple components. Accordingly, the sensitivity of the photoresist is more uniform as compared with that of photoresist that include a mixture of components. The disclosed approach makes use of the main chain scission of the polymer while under exposure. In an embodiment, relatively long polymers are broken up into smaller pieces. Accordingly, with the appropriate developer, the exposed smaller pieces are made soluble.

FIG. 1 shows skeletal formulas of a plurality of polymers according to an embodiment. FIG. 1 shows halogenated methacrylate unit 101, halogenated methacrylate unit 103, halogenated methacrylate unit 105, halogenated methacrylate unit 107, halogenated methacrylate unit 109. These polymers include double bonded oxygen atoms.

Referring to FIG. 1, the halogenated methacrylate unit 101 includes a plurality of carbon atoms and hydrogen atoms, four oxygen atoms and a CoPF6 ring. In an embodiment, to generate the halogenated methacrylate unit 101 a high absorbing unit is incorporated into a methacrylate unit. The incorporation of the high absorbing unit into the methacrylate unit increases secondary electron generation. In an embodiment, the high absorbing unit 101a can include halogen atoms F, Cl, Br and I. In other embodiments, the high absorbing unit 101a can include non-halogen atoms Bi, Co, Fe, Ge and P. In still other embodiments, the high absorbing unit 101a can include other materials. In the FIG. 1 embodiment, high absorbing units Co and PF6 are incorporated into a methacrylate unit in order to form halogenated methacrylate unit 101. In FIG. 1, X represents the incorporation of the absorbing units into the methacrylate unit. In an embodiment, the methacrylate unit 101 is formed to have one repeating unit such that microscale uniformity throughout the film is ensured.

Referring to FIG. 1, the halogenated methacrylate unit 103 includes a plurality of carbon atoms and hydrogen atoms, four oxygen atoms and a Fe ring. In an embodiment, to generate the halogenated methacrylate unit 103 a high absorbing unit is incorporated into a methacrylate unit. The incorporation of the high absorbing unit into the methacrylate unit increases secondary electron generation. In an embodiment, the high absorbing unit 103a can include halogen atoms F, Cl, Br and I. In other embodiments, the high absorbing unit 103a can include non-halogen atoms Bi, Co, Fe, Ge and P. In still other embodiments, the high absorbing unit 103a can include other materials. In the FIG. 1 embodiment, high absorbing units Fe are incorporated into a methacrylate unit in order to form halogenated methacrylate unit 103. In FIG. 1, X represents the incorporation of the absorbing units into the methacrylate unit. In an embodiment, the methacrylate unit 103 is formed to have one repeating unit such that microscale uniformity throughout the film is ensured.

The halogenated methacrylate unit 105 includes a plurality of carbon atoms and hydrogen atoms, two oxygen atoms and five atoms of F. In an embodiment, to generate the halogenated methacrylate unit 105 a high absorbing unit is incorporated into a methacrylate unit. The incorporation of the high absorbing unit into the methacrylate unit increases secondary electron generation. In an embodiment, the high absorbing unit 105a can include halogen atoms F, Cl, Br and I. In other embodiments, the high absorbing unit 105a can include non-halogen atoms Bi, Co, Fe, Ge and P. In still other embodiments, the high absorbing unit 105a can include other materials. In the FIG. 1 embodiment, high absorbing units F are incorporated into a methacrylate unit in order to form halogenated methacrylate unit 105. In FIG. 1, X represents the incorporation of the absorbing units into the methacrylate unit. In an embodiment, the methacrylate unit 105 is formed to have one repeating unit such that microscale uniformity throughout the film is ensured.

The halogenated methacrylate unit 107 includes a plurality of carbon atoms and hydrogen atoms, two oxygen atoms, an atom of Bi and two benzene rings. In an embodiment, to generate the halogenated methacrylate unit 107 a high absorbing unit is incorporated into a methacrylate unit. The incorporation of the high absorbing unit into the methacrylate unit increases secondary electron generation. In an embodiment, the high absorbing unit 107a can include halogen atoms F, Cl, Br and I. In other embodiments, the high absorbing unit 107a can include non-halogen atoms Bi, Co, Fe, Ge and P. In still other embodiments, the high absorbing unit 107a can include other materials. In the FIG. 1 embodiment, high absorbing unit Bi is incorporated into a methacrylate unit in order to form halogenated methacrylate unit 107. In FIG. 1, X represents the incorporation of the absorbing units into the methacrylate unit. In an embodiment, the methacrylate unit is formed to have one repeating unit such that microscale uniformity throughout the film is ensured.

The halogenated methacrylate unit 109 includes a plurality of carbon atoms and hydrogen atoms, two oxygen atoms and two benzene rings. In an embodiment, to generate the halogenated methacrylate unit 109 a high absorbing unit is incorporated into a methacrylate unit. The incorporation of the high absorbing unit into the methacrylate unit increases secondary electron generation. In an embodiment, the high absorbing unit 109a can include halogen atoms F, Cl, Br and I. In other embodiments, the high absorbing unit 101a can include non-halogen atoms Bi, Co, Fe, Ge and P. In still other embodiments, the high absorbing unit 109a can include other materials. In the FIG. 1 embodiment, high absorbing unit I is incorporated into a methacrylate unit in order to form halogenated methacrylate unit 109. In FIG. 1, X represents the incorporation of the absorbing units into the methacrylate unit. In an embodiment, the methacrylate unit is formed to have one repeating unit such that microscale uniformity throughout the film is ensured.

In operation, after the single molecule polymer resist has been applied to a wafer or other suitable substrate, and a desired pattern is projected onto the photoresist, the parts of the photoresist that are exposed by the extreme ultraviolet (EUV) lithography become soluble. In an embodiment, because the photoresist is formed from a polymer including a monomer having a single molecule, the layer of photoresist that is formed on the wafer has properties that are more uniform throughout the layer of photoresist than photoresists of previous approaches. As such, the response of the photoresist to EUV is uniform across the layer of photoresist. For example, the dimensional characteristics of features intended to be the same that are formed based on an exposure of the photoresist will be the same no matter the portion of the photoresist to which they correspond. Consequently, for normal distribution, embodiments enable negligible variation in the critical dimensions of patterned features up to the 7 sigma level and beyond. This is important for scaling purposes as no matter how small the portion of the photoresist is that is used to form a feature, the photoresist in that portion will respond similarly to photoresist at other locations because of the uniformity derived from the single molecule polymer.

Figure 2:
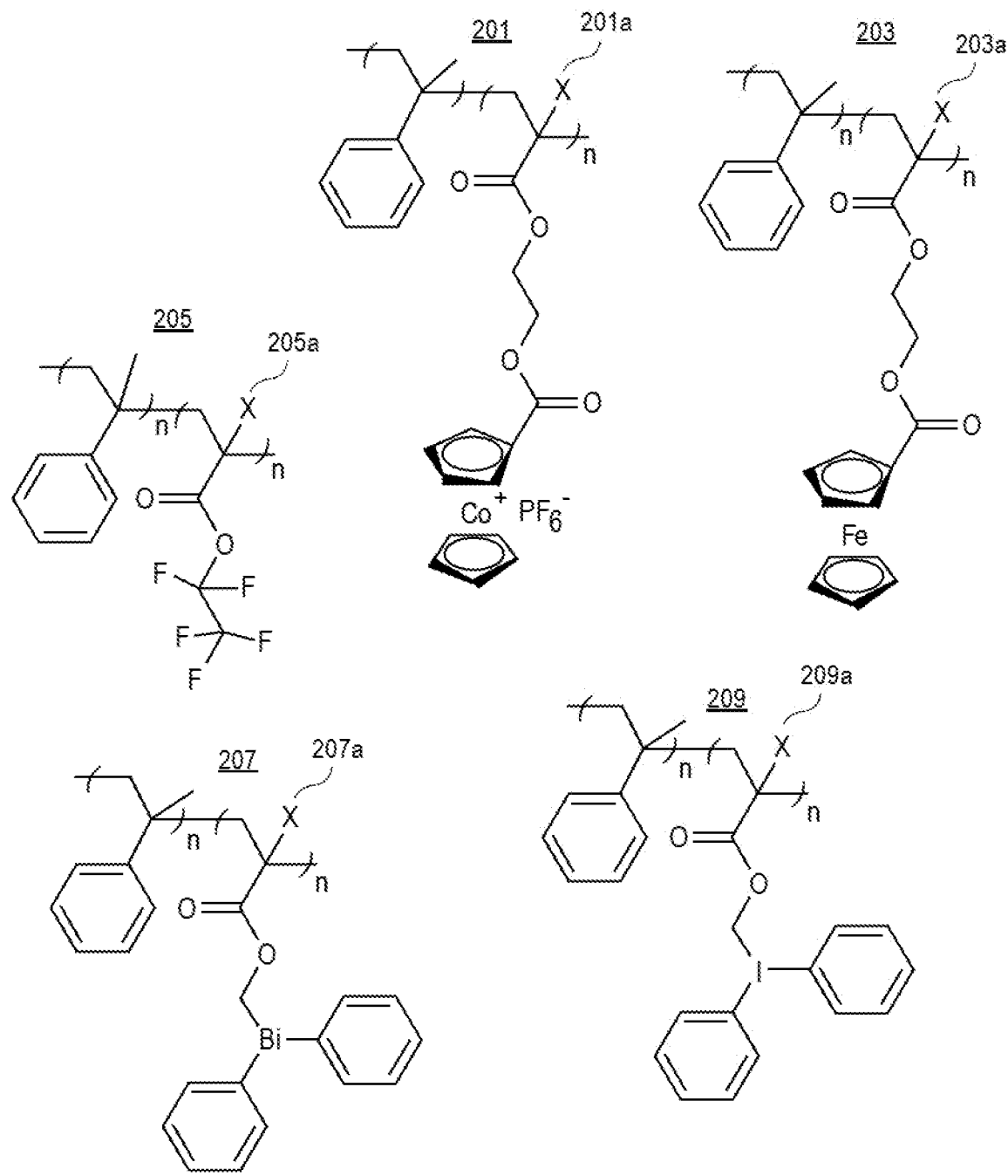
FIG. 2 shows skeletal formulas of a plurality of copolymers according to an embodiment.

FIG. 2 shows skeletal formulas of a plurality of copolymers formed according to an embodiment. In the copolymers shown in FIG. 2, to increase sensitivity of the photoresist, copolymerization of halogen-substituted, high absorbing methacrylates with alpha-methyl styrene is used. During EUV exposure, halogen and styrene radicals are generated and produce beta-radicals, which are capable of inducing main-chain scission. An even ratio of methacrylate and styrene monomers is effected in order to reduce molecular variation in the film. FIG. 2 shows representative copolymer structures. In FIG. 2, such copolymers include copolymer 201, copolymer 203, copolymer 205, copolymer 207, and copolymer 209.

Referring to FIG. 2, the copolymer 201 is a product of the copolymerization of halogen substituted, high absorbing methacrylate with alpha methyl styrene. In an embodiment, the copolymer 201 that is produced includes a plurality of carbon and hydrogen atoms, four oxygen atoms, a CoPF6 ring and a benzene ring. In an embodiment, a high absorbing unit X is incorporated into the copolymer 201 to increase secondary electron generation. In an embodiment, the high absorbing unit 201a can include halogen atoms F, Cl, Br and I. In other embodiments, the high absorbing unit 201a can include non-halogen atoms Bi, Co, Fe, Ge and P. In still other embodiments, the high absorbing unit 201a can include other materials considered suitable. In an embodiment, the copolymer 201 of FIG. 2, is produced by the incorporation of high absorbing units Co and PF6 which increases secondary electron generation. X represents the incorporation of the absorbing units into the copolymer 201.

The copolymer 203 is a product of the copolymerization of halogen substituted, high absorbing methacrylate with alpha methyl styrene. In an embodiment, the copolymer 203 that is produced includes a plurality of carbon and hydrogen atoms, four oxygen atoms, an Fe ring and a benzene ring. In an embodiment, a high absorbing unit X is incorporated into the copolymer 203 to increase secondary electron generation. In an embodiment, the high absorbing unit 203a can include halogen atoms F, Cl, Br and I. In other embodiments, the high absorbing unit 203a can include non-halogen atoms Bi, Co, Fe, Ge and P. In still other embodiments, the high absorbing unit 203a can include other materials. In an embodiment, the copolymer 203 of FIG. 2, is produced by the incorporation of high absorbing unit Fe which increases secondary electron generation. X represents the incorporation of the absorbing units into the copolymer 203.

The copolymer 205 is a product of the copolymerization of halogen substituted, high absorbing methacrylate with alpha methyl styrene. In an embodiment, the copolymer 205 that is produced includes a plurality of carbon and hydrogen atoms, two oxygen atoms, five fluorine atoms and a benzene ring. In an embodiment, a high absorbing unit X is incorporated into the copolymer 205 to increase secondary electron generation. In an embodiment, the high absorbing unit 205a can include halogen atoms F, Cl, Br and I. In other embodiments, the high absorbing unit 205a can include non-halogen atoms Bi, Co, Fe, Ge and P. In still other embodiments, the high absorbing unit 205a can include other materials. In an embodiment, the copolymer 205 of FIG. 2, is produced by the incorporation of high absorbing unit F which increases secondary electron generation. X represents the incorporation of the absorbing units into the copolymer 205.

The copolymer 207 is a product of the copolymerization of halogen substituted, high absorbing methacrylate with alpha methyl styrene. In an embodiment, the copolymer 207 that is produced includes a plurality of carbon and hydrogen atoms, two oxygen atoms, a Bi atom and three benzene rings. In an embodiment, a high absorbing unit X is incorporated into the copolymer 207 to increase secondary electron generation. In an embodiment, the high absorbing unit 207a can include halogen atoms F, Cl, Br and I. In other embodiments, the high absorbing unit 207a can include non-halogen atoms Bi, Co, Fe, Ge and P. In still other embodiments, the high absorbing unit 207a can include other materials. In an embodiment, the copolymer 207 of FIG. 2, is produced by the incorporation of high absorbing unit Bi which increases secondary electron generation. X represents the incorporation of the absorbing units into the copolymer 207.

The copolymer 209 is a product of the copolymerization of halogen substituted, high absorbing methacrylate with alpha methyl styrene. In an embodiment, the copolymer 209 that is produced includes a plurality of carbon and hydrogen atoms, two oxygen atoms, an I atom and three benzene rings. In an embodiment, a high absorbing unit X is incorporated into the copolymer 209 to increase secondary electron generation. In an embodiment, the high absorbing unit 209a can include halogen atoms F, Cl, Br and I. In other embodiments, the high absorbing unit 209a can include non-halogen atoms Bi, Co, Fe, Ge and P. In still other embodiments, the high absorbing unit 209a can include other materials. In an embodiment, the copolymer 209 of FIG. 2, is produced by the incorporation of high absorbing unit I which increases secondary electron generation. X represents the incorporation of the absorbing unit into the copolymer 209.

In operation, after the single molecule polymer resist has been applied to a wafer or other suitable substrate, and a desired pattern is projected onto the photoresist, the parts of the photoresist that are exposed by the EUV become soluble. In an embodiment, because the photoresist is formed from a polymer that includes evenly mixed monomers, the layer of photoresist that is formed on the wafer has properties that are more uniform throughout the layer of photoresist than photoresists of previous approaches. As such, the response of the photoresist to EUV is uniform across the layer of photoresist. For example, the dimensional characteristics of features intended to be the similar that are formed based on an exposure of the photoresist will be the similar no matter the portion of the photoresist to which they correspond. Consequently, for normal distribution, embodiments enable negligible variation in the critical dimensions of patterned features up to the 7 sigma level and beyond. This is very important for scaling purposes as no matter how small the portion of the photoresist is that is used to form a feature, the photoresist in that portion will respond similarly to photoresist at other locations because of the uniformity derived from evenly mixed copolymer components.

Figure 3:
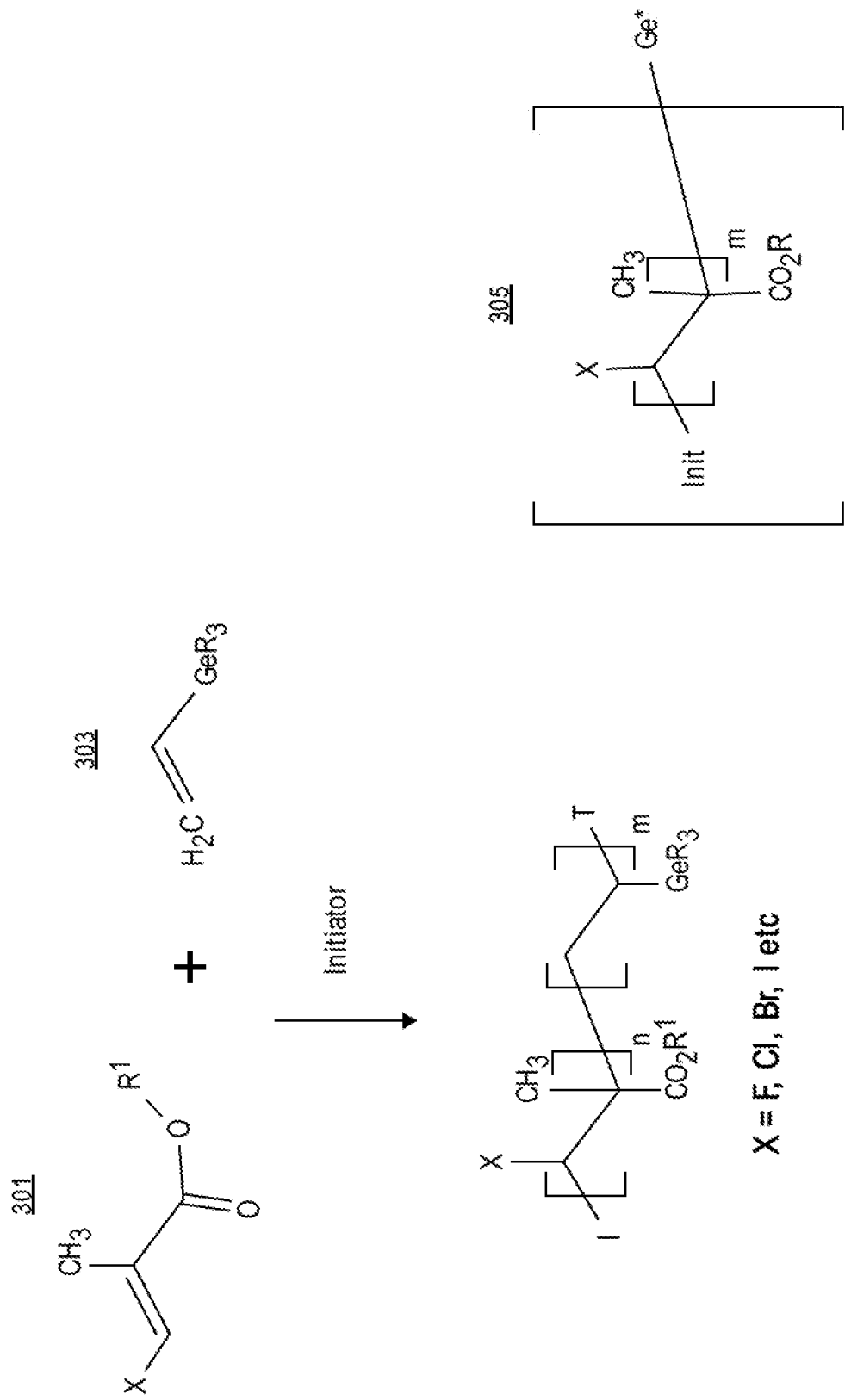
FIG. 3 is an illustration of the addition of multiple polymeric chains to a cluster composed of Ge atoms according to an embodiment.

FIG. 3 is an illustration of the addition of multiple polymeric chains to a cluster composed of Ge atoms according to an embodiment. FIG. 3 shows polymeric chain 301 and cluster 303 that includes Ge. Referring to FIG. 3, the polymeric chain 301 is added to the cluster that includes Ge atoms 303 during synthesis. In particular, in this embodiment, the halogen-substituted methacrylate polymeric chain 301 is copolymerized with a cluster of Ge atoms that includes vinylgermanium (or tin) species. This introduces both a higher absorbing element and alternative site for rupture. For example, the copolymerization causes the formation of a radical center either in place of GeR3 group or the halogen X, and elicits a bond cleavage reaction by using the formation of stable X—GeR3 as a driving force. Alternatively, multiple polymeric chains can be added during synthesis to a Ge atom or cluster composed of Ge atoms as shown at 305.

In an embodiment, because the copolymer is evenly mixed, the layer of photoresist that is formed on the wafer has properties that are more uniform throughout the layer of photoresist than photoresists of previous approaches. As such, the response of the photoresist to EUV is uniform across the layer of photoresist similarly to the embodiments of FIGS. 1 and 2.

Figure 4:
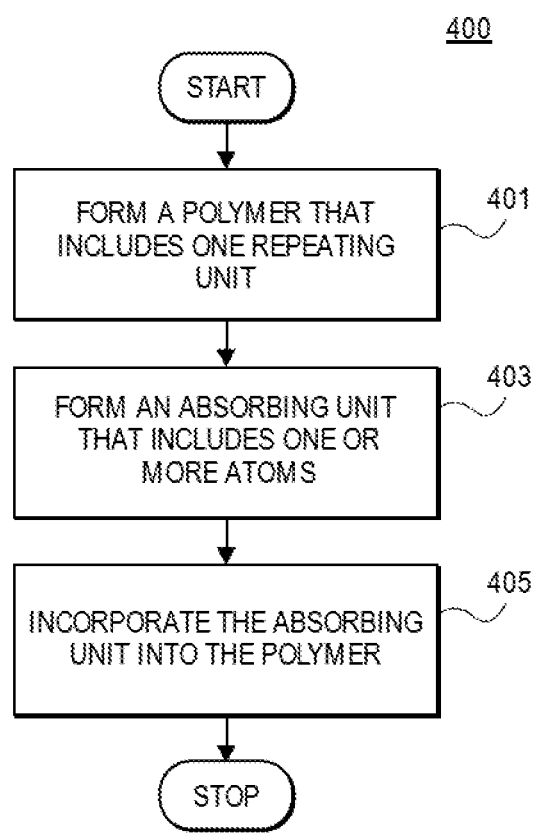
FIG. 4 is a flowchart of a method for forming chain scission photoresists according to an embodiment.

FIG. 4 is a flowchart of a method for forming chain scission photoresists according to an embodiment. Referring to FIG. 4, at 401 a polymer is formed that includes one repeating unit. At 403, an absorbing unit is formed. At 405, the absorbing unit is incorporated into the polymer. In an embodiment, one or more of operations 401-405 can be nonconsecutive operations that occur in parallel. In an embodiment, one or more of operations 401-405 may not be used as a part of the method. In an embodiment, operations other than 401-405 can be used as a part of the method. In an embodiment, the polymer includes a monomer that consist of acrylate unit. In an embodiment, the absorbing unit can include halogen atoms F, Cl, Br and I. In other embodiments, the absorbing unit can include non-halogen atoms Bi, Co, Fe, Ge and P. In an embodiment, the one or more halogen atoms are configured to cause increased secondary electron generation. In an embodiment, portions of the polymer that are exposed to EUV become soluble to a developer. In an embodiment, portions of the polymer that are not exposed to EUV are not soluble to a developer.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
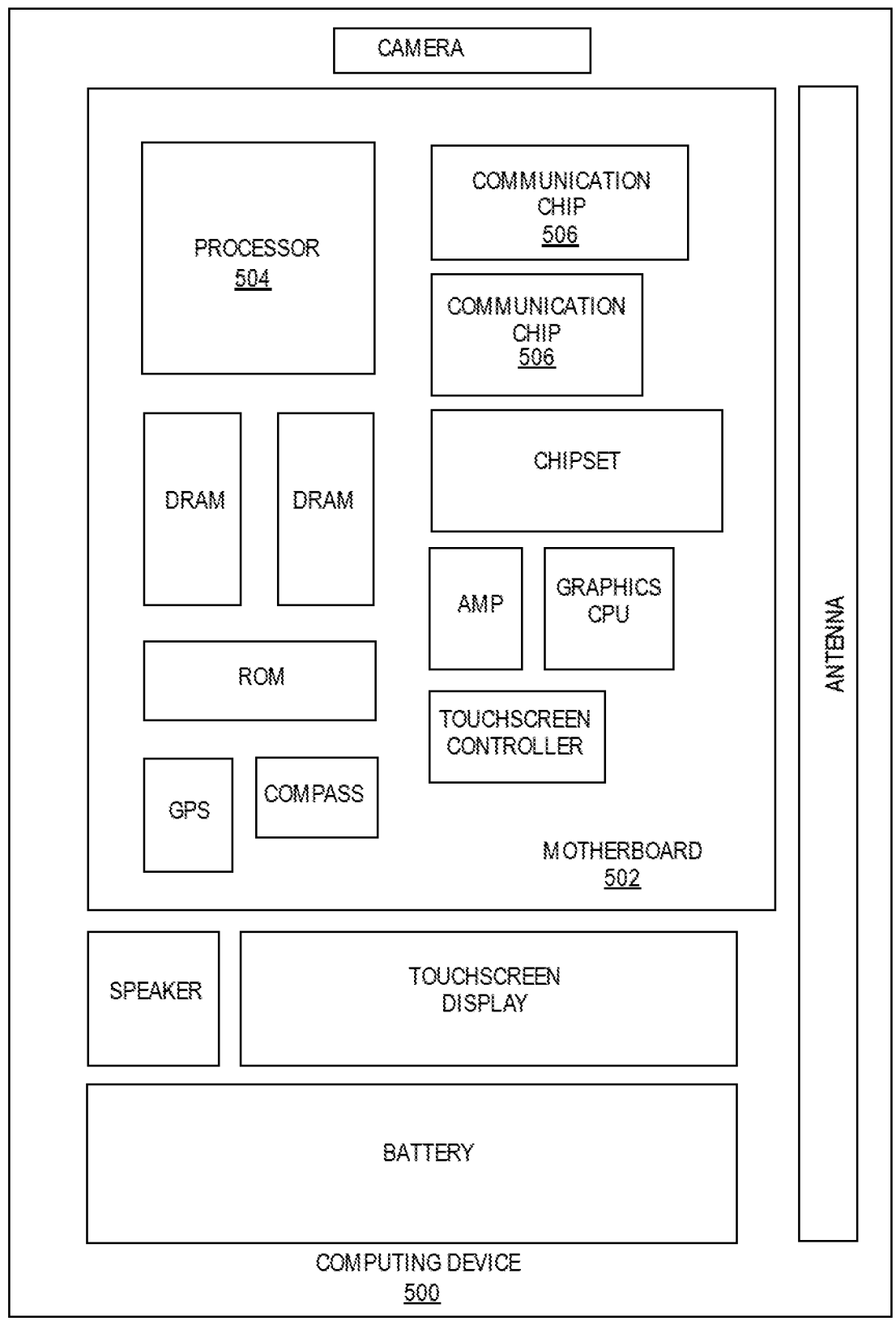
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
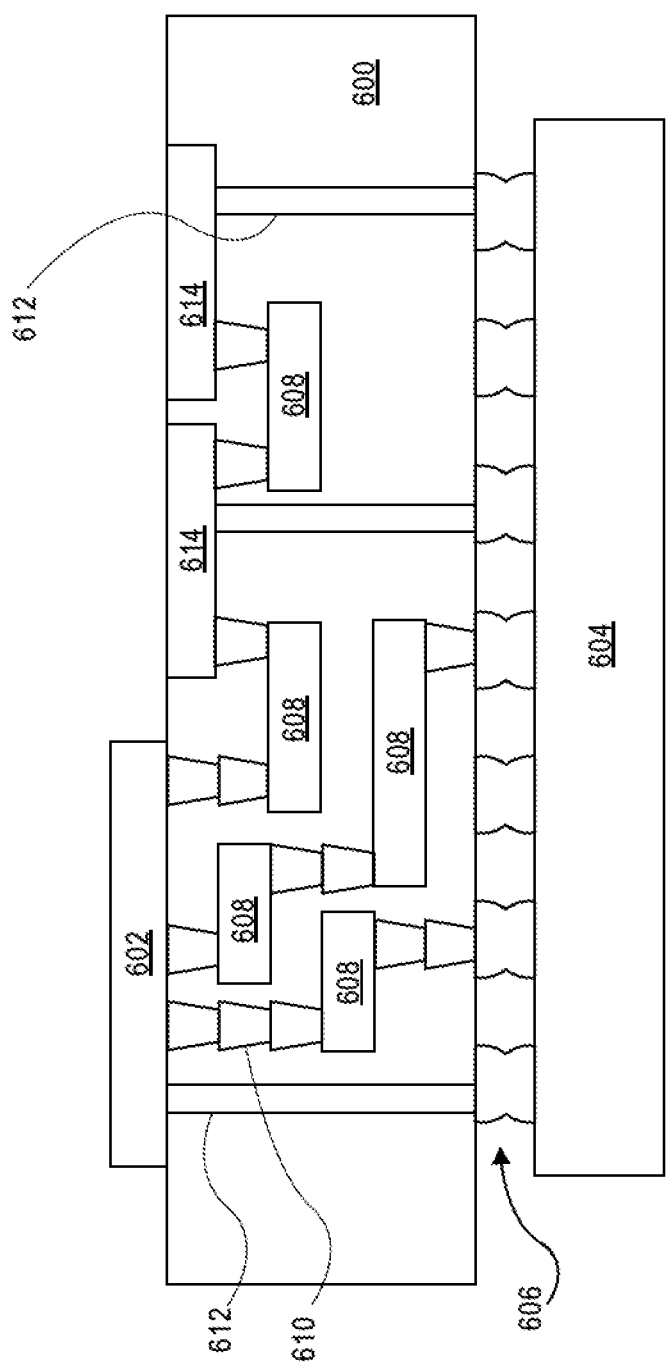
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

The following examples pertain to further embodiments. The various features of the different embodiments may be variously combined with some features included and others excluded to suit a variety of different applications.

Example embodiment 1: A photoresist including a polymer with one repeating unit and an absorbing unit.

Example embodiment 2: The photoresist of example embodiment 1, wherein the polymer includes a monomer that consist of a halogenated crylate unit.

Example embodiment 3: The photoresist of example embodiment 1, wherein the absorbing unit includes one or more halogen atoms including F, Cl, Br and I.

Example embodiment 4: The photoresist of example embodiment 1, wherein the absorbing unit includes Bi, Co, Fe, Ge and P.

Example embodiment 5: The photoresist of example embodiment 1, wherein the one or more halogen atoms are configured to cause increased secondary electron generation.

Example embodiment 6: The photoresist of example embodiment 1, wherein portions of the polymer that are exposed to EUV become soluble to a developer.

Example embodiment 7: The photoresist of example embodiment 1, 2, 3, 4, 5 and 6 wherein portions of the polymer that are not exposed to EUV are not soluble to a developer.

Example embodiment 8: A photoresist includes a copolymer that includes two repeating units and a polymer that includes alpha-methyl styrene and an absorbing unit.

Example embodiment 9: The photoresist of example embodiment 8, wherein one of the repeating units includes a monomer that consist of a halogenated crylate unit.

Example embodiment 10: The photoresist of example embodiment 8, wherein the absorbing unit includes one or more halogen atoms including F, Cl, Br and I.

Example embodiment 11: The photoresist of example embodiment 8, wherein the absorbing unit includes Bi, Co, Fe, Ge and P.

Example embodiment 12: The photoresist of example embodiment 10, wherein the one or more halogen atoms are configured to cause increased secondary electron generation.

Example embodiment 13: The photoresist of example embodiment 8, 9, 10, 11 and 12 wherein portions of the photoresist that are exposed to EUV become soluble to a developer.

Example embodiment 14: The photoresist of example embodiment 8, wherein portions of the phototresist that are not exposed to EUV are not soluble to a developer.

Example embodiment 15: A method comprising forming a polymer with one repeating unit and forming an absorbing unit.

Example embodiment 16: The method of example embodiment 15, wherein the polymer includes a monomer that consist of a halogenated crylate unit.

Example embodiment 17: The method of example embodiment 15, wherein the absorbing unit includes one or more halogen atoms including F, Cl, Br and I.

Example embodiment 18: The method of example embodiment 15, wherein the absorbing unit includes Bi, Co, Fe, Ge and P.

Example embodiment 19: The method of example embodiment 15, wherein the one or more halogen atoms are configured to cause increased secondary electron generation.

Example embodiment 20: The method of example embodiment 15, 16, 17, 18 and 19 wherein portions of the polymer that are exposed to EUV become soluble to a developer.

What is claimed is:

1. A photoresist, comprising:
a polymer with one repeating unit; and
an absorbing unit, wherein the absorbing unit includes an element selected from the group consisting of Bi, Co, Fe and Ge.

2. The photoresist of claim 1, wherein portions of the polymer that are exposed to EUV become soluble to a developer.

3. The photoresist of claim 1, wherein portions of the polymer that are not exposed to EUV are not soluble to a developer.

4. A photoresist, comprising:
a copolymer that includes two repeating units and a polymer that includes alpha-methyl styrene; and
an absorbing unit, wherein the absorbing unit includes an element selected from the group consisting of Bi, Co, Fe and Ge.

5. The photoresist of claim 4, wherein portions of the photoresist that are exposed to EUV become soluble to a developer.

6. The photoresist of claim 4, wherein portions of the phototresist that are not exposed to EUV are not soluble to a developer.

7. A photoresist, comprising:
a polymer with one repeating unit; and
an absorbing unit, wherein the absorbing unit includes Br.

8. The photoresist of claim 7, wherein the Br is configured to cause increased secondary electron generation.

9. The photoresist of claim 7, wherein portions of the polymer that are exposed to EUV become soluble to a developer.

10. The photoresist of claim 7, wherein portions of the polymer that are not exposed to EUV are not soluble to a developer.

* * * * *